(12) United States Patent
Aoki et al.

(10) Patent No.: US 9,299,606 B2
(45) Date of Patent: Mar. 29, 2016

(54) FABRICATING PILLAR SOLDER BUMP

(71) Applicant: International Business Machines Corporation, Armonk, NY (US)

(72) Inventors: Toyohiro Aoki, Yokohama (JP); Hiroyuki Mori, Yasu (JP); Kazushige Toriyama, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/548,583

(22) Filed: Nov. 20, 2014

(65) Prior Publication Data
US 2015/0155255 A1 Jun. 4, 2015

(30) Foreign Application Priority Data

Nov. 29, 2013 (JP) .................................. 2013-247505

(51) Int. Cl.
*H01L 21/00* (2006.01)
*H01L 23/48* (2006.01)
(Continued)

(52) U.S. Cl.
CPC .... *H01L 21/76877* (2013.01); *H01L 21/76802* (2013.01); *H01L 23/34* (2013.01); *H01L 23/345* (2013.01); *H01L 23/5226* (2013.01); *H01L 24/11* (2013.01); *H01L 24/17* (2013.01); *H01L 24/27* (2013.01); *H01L 24/32* (2013.01); *H01L 24/81* (2013.01); *H01L 24/83* (2013.01); *H01L 25/0657* (2013.01); *H01L 25/50* (2013.01); *H01L 23/488* (2013.01); *H01L 2224/11013* (2013.01); *H01L 2224/1131* (2013.01); *H01L 2224/16145* (2013.01); *H01L 2224/16227* (2013.01); *H01L 2224/81203* (2013.01); *H01L 2224/81801* (2013.01); *H01L 2224/83203* (2013.01); *H01L 2224/94* (2013.01);
(Continued)

(58) Field of Classification Search
CPC ................... H01L 21/76877; H01L 21/76802; H01L 21/76843; H01L 23/5226; H01L 24/81; H01L 24/27; H01L 24/11; H01L 23/481; H01L 23/488; H01L 24/17; H01L 23/345
See application file for complete search history.

(56) References Cited

U.S. PATENT DOCUMENTS 6,190,940 B1 * 2/2001 DeFelice et al. .............. 438/106
6,228,678 B1 * 5/2001 Gilleo et al. .................. 438/108

(Continued)

FOREIGN PATENT DOCUMENTS

JP 08064639 A 3/1996
JP 09213701 A 8/1997
(Continued)

OTHER PUBLICATIONS

JP Application 2013247505, entitled "Substrate Bonding Method, Bump Forming Method, and Semiconductor Device", filed Nov. 29, 2013.

*Primary Examiner* — Alonzo Chambliss
(74) *Attorney, Agent, or Firm* — Jonathan V. Sry

(57) ABSTRACT

A substrate bonding method is able to reliably bond substrates while avoiding a reduction in yield made worse by finer pitches. The substrate bonding method can include: forming an adhesive resin layer on a surface of a first substrate on which a pad has been formed; forming an opening on the adhesive resin layer above the pad; filling the opening with molten solder to form a pillar-shaped solder bump; and applying heat and pressure to the first substrate and a second substrate while a terminal formed on the second substrate is aligned with the solder bump.

14 Claims, 8 Drawing Sheets

(51) Int. Cl.
  *H01L 21/768* (2006.01)
  *H01L 23/00* (2006.01)
  *H01L 23/34* (2006.01)
  *H01L 23/522* (2006.01)
  *H01L 25/065* (2006.01)
  *H01L 25/00* (2006.01)
  *H01L 23/488* (2006.01)

(52) U.S. Cl.
  CPC ............... *H01L2225/06513* (2013.01); *H01L 2225/06568* (2013.01); *H01L 2924/014* (2013.01); *H01L 2924/06* (2013.01); *H01L 2924/37001* (2013.01)

(56) References Cited

U.S. PATENT DOCUMENTS

| | | | |
|---|---|---|---|
| 7,098,071 B2 * | 8/2006 | Ho et al. | 438/106 |
| 7,943,422 B2 * | 5/2011 | Boon | 438/108 |
| 8,441,123 B1 * | 5/2013 | Lee et al. | 257/737 |
| 2005/0153101 A1 * | 7/2005 | Yamaguchi et al. | 428/131 |
| 2006/0261475 A1 * | 11/2006 | Boon | 257/737 |
| 2006/0261493 A1 * | 11/2006 | Boon | 257/778 |
| 2009/0197103 A1 * | 8/2009 | Shih et al. | 428/457 |
| 2009/0289346 A1 * | 11/2009 | Lee et al. | 257/690 |

FOREIGN PATENT DOCUMENTS

| | | |
|---|---|---|
| JP | 09237806 A | 9/1997 |
| JP | 10050709 A | 2/1998 |
| JP | 2000036509 A | 2/2000 |
| JP | 2001196404 A | 7/2001 |
| JP | 2006060219 A | 3/2006 |
| JP | 2010034601 A | 2/2010 |
| JP | 2010263137 A | 11/2010 |
| JP | 4826924 B2 | 11/2011 |
| JP | 2012532459 A | 12/2012 |

* cited by examiner

FABRICATING PILLAR SOLDER BUMP

CROSS REFERENCE TO RELATED APPLICATION

This application claims priority to Japan Patent Application No. 2013-247505, filed Nov. 29, 2013, which is incorporated herein in its entirety.

BACKGROUND

The present disclosure relates to a substrate bonding method, and more specifically to the formation of bumps using an adhesive resin, and to bonding a substrate using these bumps.

Methods for mounting chips on substrates known as "flip-chip techniques," in which the bottom surface of a die and a substrate are connected via bumps arranged in the form of an array, are conventionally well-known. Among these techniques, the widely used controlled collapse chip connection (C4) technique, which uses solder balls as bumps. In the C4 technique, the solder bumps on the electrode pads on the bottom surface of the die are aligned with the substrate terminals, the solder is then melted, and the electrode pads on the bottom of the die are now connected electrically to the substrate terminals. Finally, the gap between the substrate and the die are filled with an under fill agent to secure the die.

However, these solder bumps have become finer as chips have become more highly integrated, and the pitch has become narrower. As a result, the gap between chips and substrates has narrowed, and under fill agents have become difficult to use.

In order to ensure that there is a sufficient gap between chips and substrates, the use of Cu pillar bumps which form solder bumps on copper columns (pillars) formed using a plating technique has been studied. However, there is a problem with these Cu pillar bumps.

First, the elastic modulus of copper is more than three times that of solder materials, and the yield stress is more than eight times that of solder materials. As a result, the thermal stress that occurs when a chip is bonded to a substrate (for example, the stress that occurs due to the difference in thermal expansion coefficients between a silicon chip and an organic substrate) cannot be sufficiently buffered. As a result, the chip is subjected to a significant amount of thermal stress, and cracks develop in wiring layers using dielectric interlayer insulating film which has low mechanical strength. This decreases yields. Second, copper pillar bumps are formed using electrolytic plating, which causes a variation in the height of the bumps. As a result, the bonding ability of the bumps and substrate terminals becomes unstable. These problems have been exacerbated by finer pitches.

SUMMARY

The present disclosure provides a substrate bonding method comprising the steps of: forming an adhesive resin layer on a surface of a first substrate, on which a pad has been formed; forming an opening on the adhesive resin layer above the pad; filling the opening with molten solder to form a pillar-shaped solder bump; and applying heat and pressure to the first substrate and a second substrate, while a terminal formed on the second substrate is aligned with the solder bump.

The present disclosure is able to provide a substrate bonding method which is able to reliably bond substrates, while avoiding reductions in yield exacerbated by finer pitches.

DETAILED DESCRIPTION

Figure 1A:
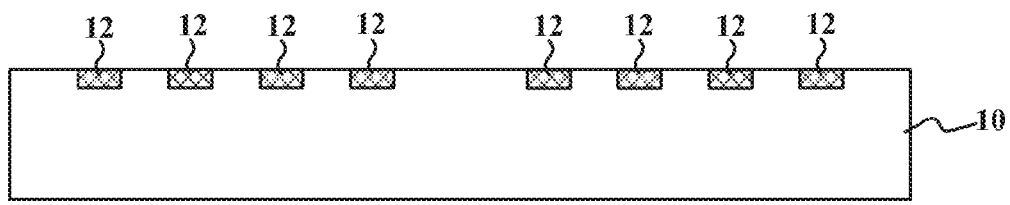
FIG. 1A a substrate is prepared with a plurality of electrode pads, according to an embodiment.

The following is an explanation of an embodiment of the present disclosure with reference to the drawings. It should be understood that there is no intent to limit the scope of the present disclosure to the embodiment shown in the drawings.

In the drawings described below, the same reference signs are used to denote the same elements unless otherwise noted.

Each of the diagrams referenced below has been exaggerated as necessary to aid in the explanation of the present disclosure and may not be to scale. In each of the diagrams, depiction of certain aspects of the configuration not directly related to the present disclosure, such as wiring, and under bump metal (UBM) have been omitted.

FIG. 1 is a diagram schematically showing the steps of the bump forming method according to this disclosure. The following is an explanation of the steps in the bump forming method of the present embodiment with reference to FIG. 1.

In the present embodiment, as shown in FIG. 1A, a substrate 10 is first prepared in which a plurality of electrode pads 12 that have been formed on the surface. The substrate 10 in the present embodiment can be made of any type of rigid or flexible material on which a plurality of electrode pads 12 can be formed. Examples include silicon substrates, organic substrates, and ceramic substrates. The substrate 10 can be also any type of substrate on which a plurality of electrode pads can be formed. Examples include dies diced from a wafer, wafers processed for wafer level chip size packages (WL-CSP), interposers for rewiring, main substrates, and package substrates.

Figure 1B:
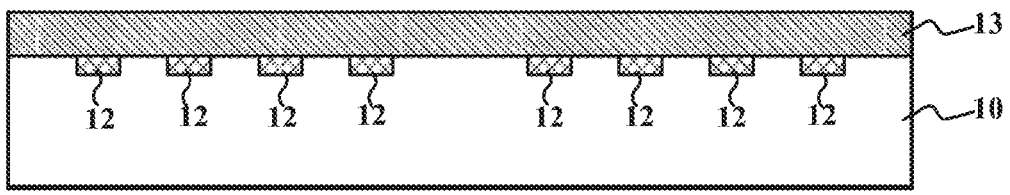
FIG. 1B an adhesive resin layer is formed on the surface of the prepared substrate, according to an embodiment.

In the present embodiment, as shown in FIG. 1B, an adhesive resin layer 13 is then formed on the surface of the prepared substrate 10 (the surface on which the electrode pads 12 have been formed). More specifically, a thermosetting resin composition is applied uniformly over the surface of the substrate 10 using any technique common in the art, such as spin coating. The resin is temporarily cured to form an adhesive resin layer 13. In the present embodiment, the adhesive resin layer 13 is thermally adhesive, and preferably photosensitive.

Figure 1C:
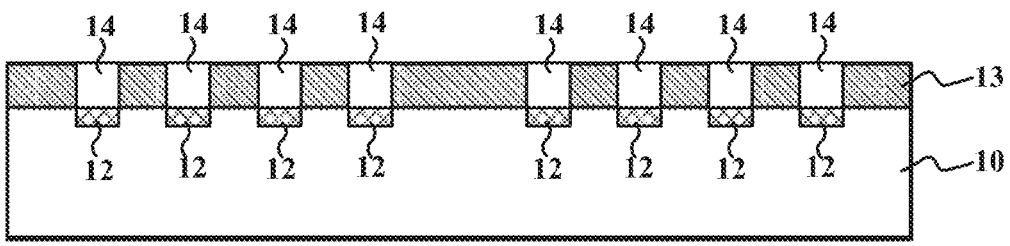
FIG. 1C the adhesive resin layer is patterned to form openings above the pads on the prepared substrate, according to an embodiment.

In the present embodiment, as shown in FIG. 1C, the adhesive resin layer 13 is patterned to form openings over the electrode pads 12 (referred to simply as pads 12 below). This patterning can be performed using any technique common in the art, for example, laser application or dry etching. When the adhesive resin layer 13 is photosensitive, the patterning can be patterned using exposure to light and development. As a result of patterning, openings 14 are formed directly above the pads 12, and the top surface of the pads 12 are exposed.

In the present embodiment, an injection molding technology is then used to fill the openings 14 with molten solder. The solder material can be a lead-free solder using tin, indium, a tin alloy, or an indium alloy that contains Ag, Cu, Zn, Bi, In, Sb, Ni, Co, Ge and/or Fe.

Figure 1D:
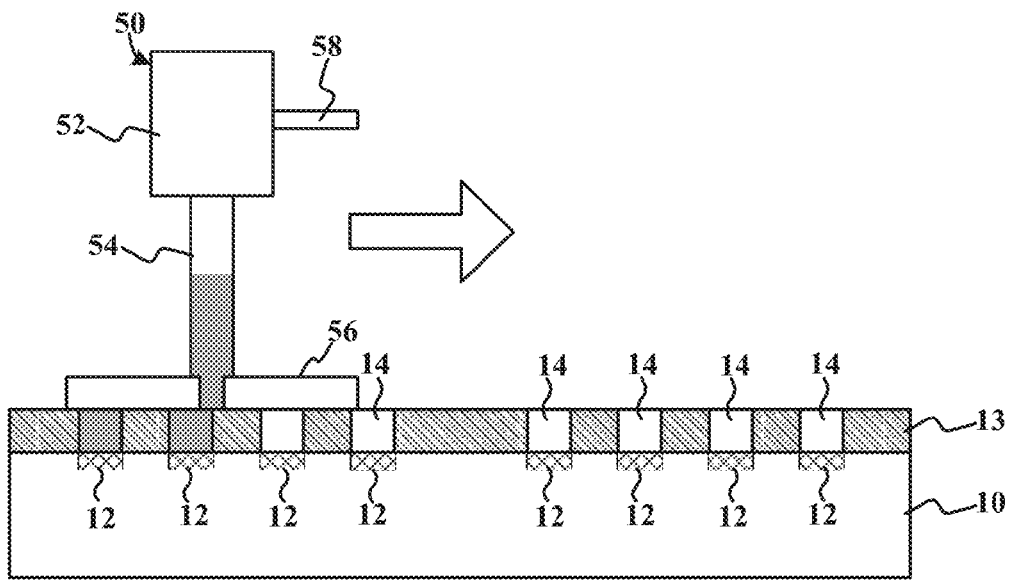
FIG. 1D the openings in the resin layer are filled with molten solder, according to an embodiment.

In the present embodiment, the molten solder filling step can be performed using injection molded soldering (IMS). FIG. 1D shows a molten solder filling step performed using the IMS technique. Here, a filling head 50 including a reservoir 52 for holding the molten solder, a channel 54, and a discharge slot 56, moves in a horizontal direction while making substantial contact with the adhesive resin layer 13. As this is occurring, the molten solder is pushed through the channel 54 below via a port 58 by applying back pressure on the reservoir 52. As a result, the molten solder is supplied directly to the opening 14 directly beneath the discharge slot 56 and the opening 14 is filled.

Figure 1E:
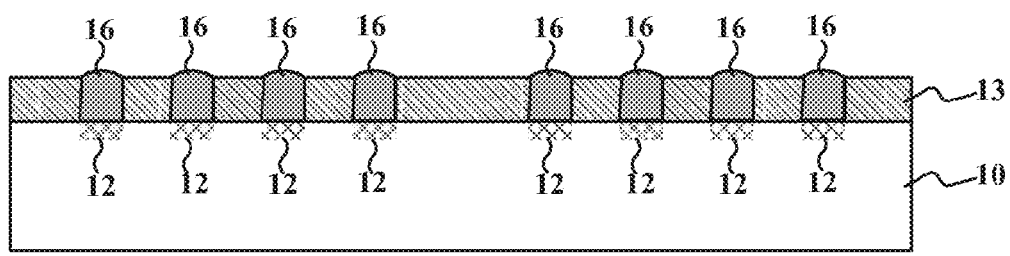
FIG. 1E the molten solder solidifies inside the openings forming pillar-shaped bumps according to an embodiment.

The molten solder filling of the openings 14 via the discharge slot 56 later solidifies inside the openings 14. As a result, and as shown in FIG. 1E, a pillar-shaped bump 16 (referred to below as a solder pillar bump 16) is formed directly above each pad 12. In the present embodiment, the head of each solder pillar bump 16 has a convex shape because of surface tension. When solidified, they protrude somewhat above the top surface of the adhesive resin layer 13.

The solder pillar bump forming method was explained above with reference to FIG. 1. The following is an explanation of the substrate bonding method, using these solder pillar bumps, with reference to FIG. 2.

Figure 2A:
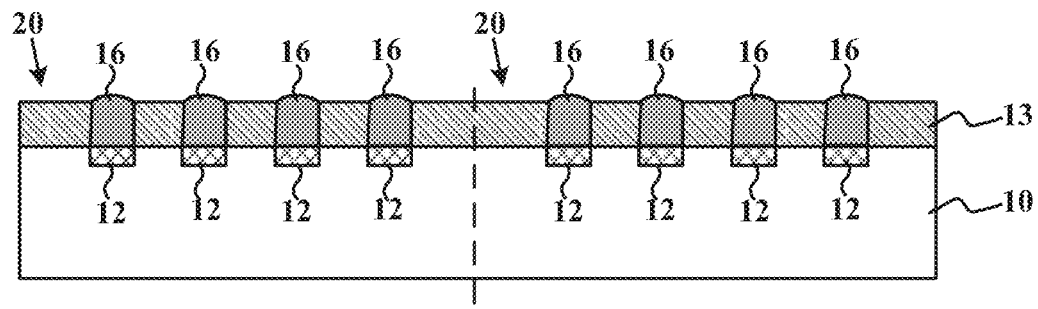
FIG. 2A a substrate with formed pillar-shaped bumps is diced to form a die, according to an embodiment.

FIG. 2 is a diagram schematically showing the steps of the substrate bonding method using solder pillar bumps according to an embodiment. In the present embodiment, a substrate is first prepared in which solder pillar bumps have been formed. Here, as shown in FIG. 2A, the substrate is a wafer that has been processed for WL-CSP, and the substrate on which solder pillar bumps 16 have been formed, is diced to obtain a die 20.

Next, the substrate 30 on which the die 20 is to be bonded is prepared. The substrate 30 in the present embodiment can be any substrate on which a plurality of terminals 32 can be formed to connect to the solder pillar bumps. Because many of the details are the same as those in the substrate 10 described above, further explanation has been omitted.

Figure 2B:
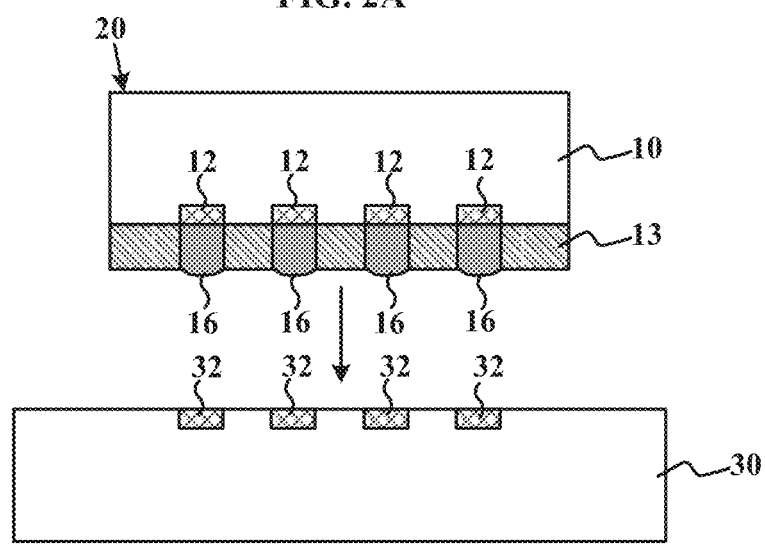
FIG. 2B the die is aligned with pads of a substrate such that the pillar-shaped bumps are lined up with the pads of the substrate, according to an embodiment.
Figure 2C:
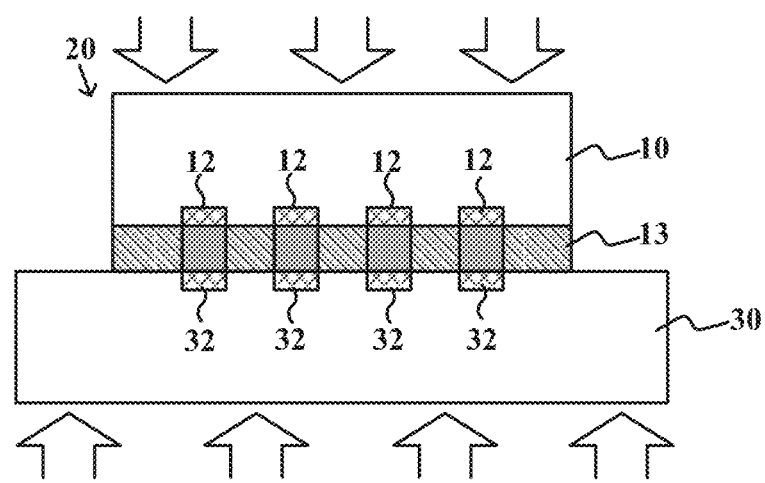
FIG. 2C heat and pressure are applied to bond the die to the substrate, according to an embodiment.

In the present embodiment, the die 20 and the substrate 30 are next bonded using the flip-chip technique. More specifically, as shown in FIG. 2B, the surface of the die 20 on which the solder pillar bumps have been formed is facing downward, and the positions of the solder pillar bumps 16, are aligned with the positions of the terminals 32, on the substrate 30. Afterwards, as shown in FIG. 2C, heat and pressure are applied to bond the die 20, and the substrate 30.

Figure 3:
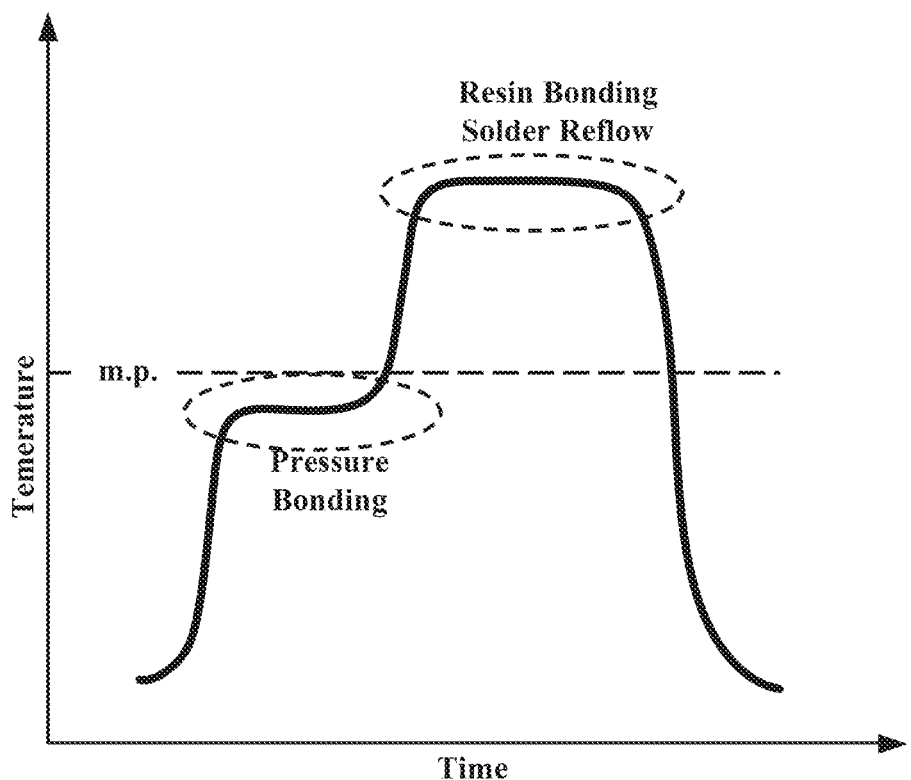
FIG. 3 is a set of graphs showing the temperature profile, and the bonding pressure profile, in the bonding step according to an embodiment.
Figure 3:
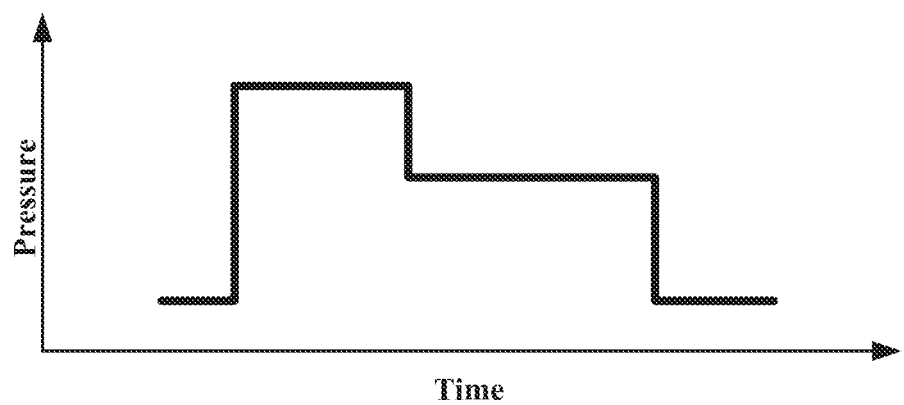

The following is an explanation, with reference to FIG. 3, of the relationship between temperature and bonding pressure in the bonding step described above.

FIG. 3 shows the correspondence between the temperature profile and the bonding pressure profile in the bonding step. In the present embodiment, as shown in FIG. 3, sufficient pressure is first applied at a temperature below the melting point (m.p.) of the solder material constituting the solder pillar bumps 16, and the die 20 and the substrate 30 are pressure-bonded. At this stage, the solder pillar bumps 16 formed on the die 20 have not melted, and the adhesive resin layer 13 does not exhibit thermal adhesiveness.

Afterwards, the bonding pressure is lowered somewhat, the temperature is raised above the melting point (m.p.) of the solder material, and reflow processing is performed. At this stage, the solder pillar bumps 16 formed on the die 20 have melted, and spread to the terminals 32 on the substrate 30. Also, the adhesive resin layer 13 exhibits thermal adhesiveness, and adheres to the surface of the substrate 30, on which the terminals 32 have been formed.

In the subsequent cooling step, the molten solder and the bonded layer of the adhesive resin layer 13 are solidified. As a result, the pads 12 and terminals 32 are connected electrically via the solder pillar bumps 16, and the die 20 is reliably secured to the substrate 30.

Figure 4:
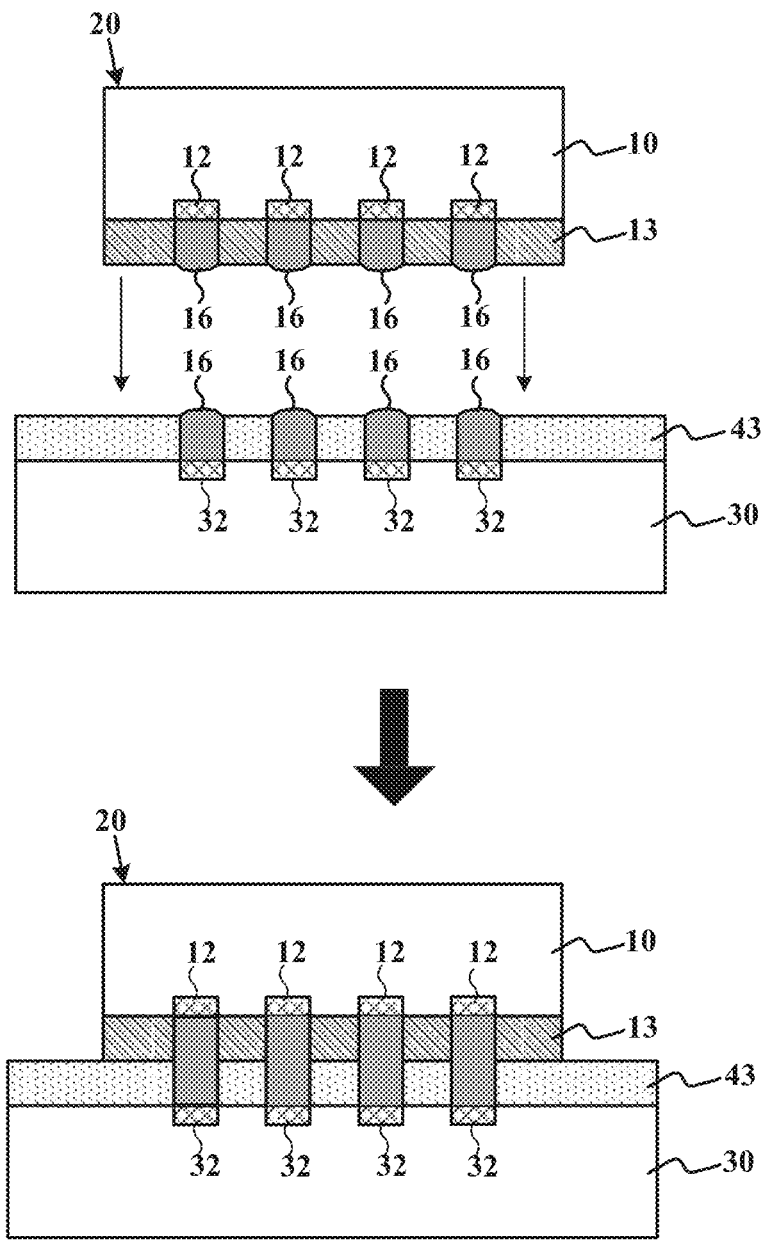
FIG. 4 is a diagram showing the manner in which substrates, on which solder pillar bumps structures have been formed, are bonded.

In FIG. 2 described above, electrode pads are formed as the terminals 32 on the substrate 30. However, this is merely an example. The terminals connected to the tips of the solder pillar bumps 16 can be bumps instead of electrode pads. FIG. 4 shows substrates on which the solder pillar bumps described above have been formed and which have been bonded to each other using the flip-chip technique. If an adhesive resin layer 13 has been formed on substrate 10, the resin layer 43 formed on substrate 30 does not have to be thermally adhesive.

A substrate bonding method using solder pillar bumps was explained above. The following is an explanation of the effects of the substrate bonding method of the present disclosure.

First, the adhesive resin layer 13 used to form the solder pillar bumps 16 simultaneously bonds the substrate and functions as an under fill agent. As a result, an under fill agent adding step is not required which is an advantage from the standpoint of cost.

Second, it allows for finer pitches than the controlled collapse chip connection (C4) technique. This will be explained with reference to FIG. 5.

Figure 5B:
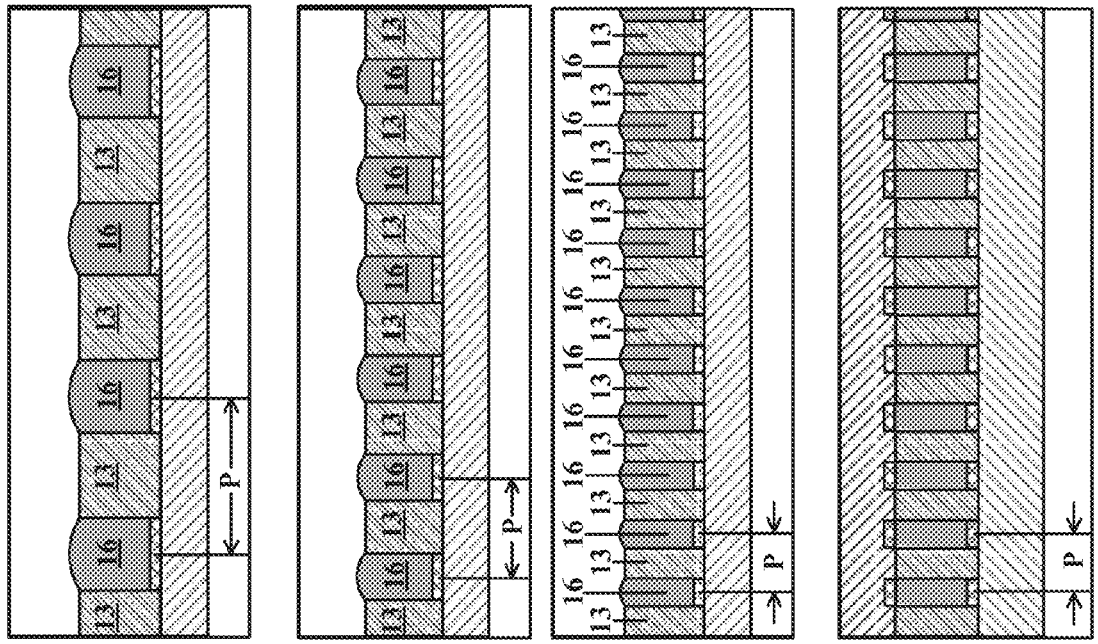
FIG. 5B is a conceptual diagram used to explain the results of the substrate bonding method, according to an embodiment.
Figure 5A:
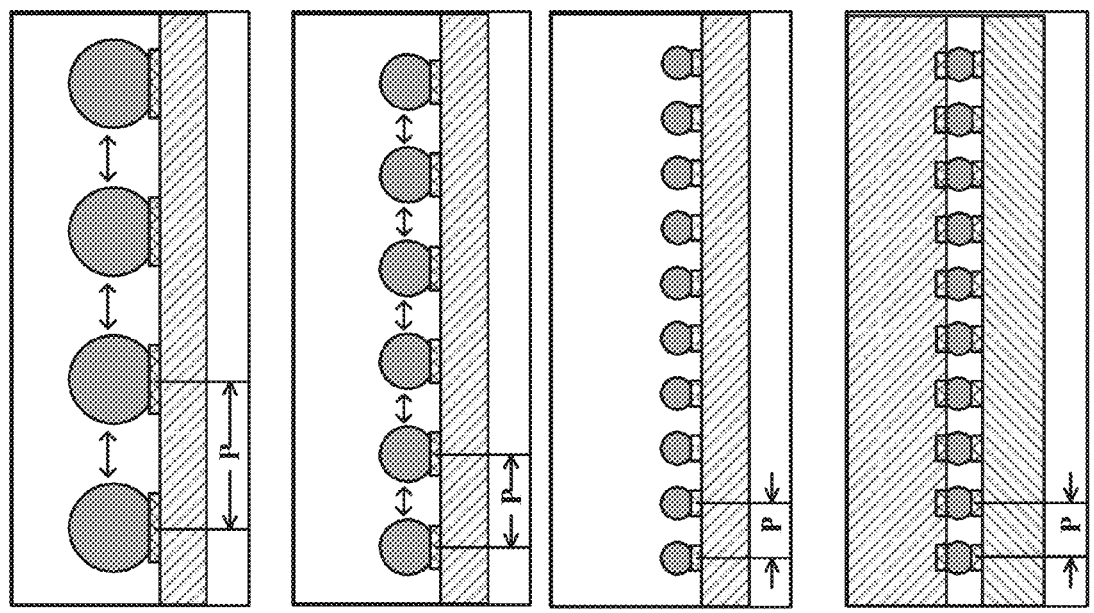
FIG. 5A is a conceptual diagram for the C4 technique, according to an embodiment.

In the C4 technique, as shown in FIG. 5A, the distance between adjacent solder balls decreases and the risk of contact between solder balls increases as the pad pitch P is narrowed. Because the diameter of solder balls also decreases as the pad pitch P becomes narrower, a sufficient gap between the two bonded substrates cannot be ensured and, as a result, it is difficult to fill the gap with an under fill agent. This causes problems such as increased processing times and solder shorts due to a lack of under filling. For these reasons, use of the C4 technique is limited with respect to finer pitches.

However, in the present disclosure, as shown in FIG. 5B, there is an adhesive resin layer 13 between adjacent solder pillar bumps 16 even when the distance between bumps becomes smaller because of a narrower pad pitch P. As a result, there is no need to be concerned about solder shorts.

Third, because the elastic modulus of the solder metal constituting the solder pillar bumps 16 is one-third that of copper, the thermal stress occurring between substrates can be sufficiently buffered, as compared to the structure of the prior art in which a gap is insured between substrates using Cu pillar bumps. As a result, cracking is less likely to occur, and yields are improved even for substrates using more porous dielectric interlayer insulating film in the wiring layers.

Fourth, no resin remains on the heads of the solder pillar bumps 16 in the configuration obtained using the bump forming method, and resin does not become caught during the substrate bonding process.

Figure 6:
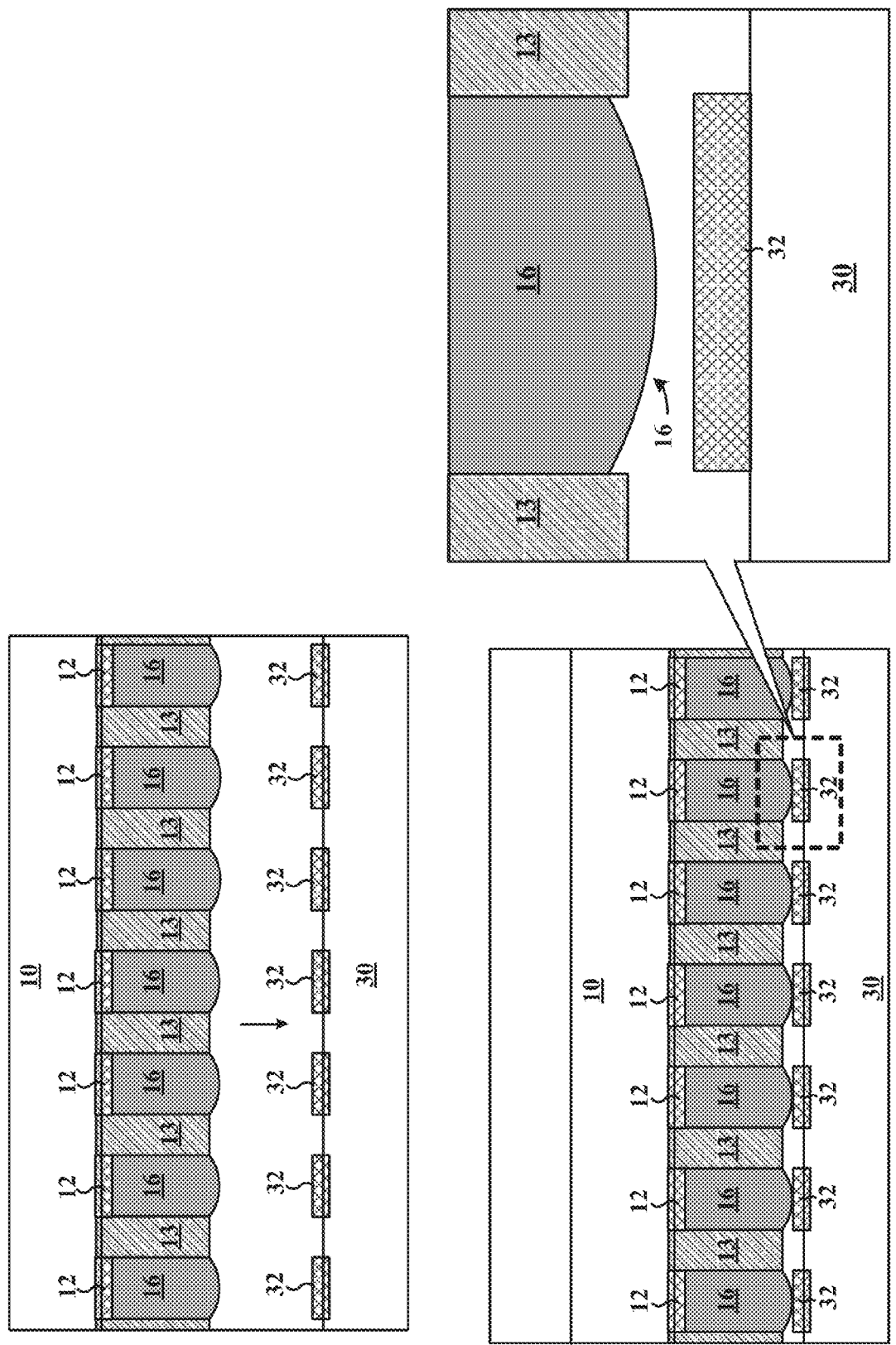
FIG. 6 is a conceptual diagram used to explain the results of the substrate bonding method, according to an embodiment.

Fifth, unlike Cu pillar bumps which tend to vary in bump height, the bump height of solder pillar bumps is easily aligned. Also, as shown in FIG. 6, the heads 16 protrude somewhat above the top surface of the adhesive resin layer 13 and make reliable contact with the substrate terminals 32. As a result, more reliable bonding occurs.

As explained above, the present disclosure can adequately address finer pitches which will become more prevalent in the future.

Here, one problem that is exacerbated by higher integration such as finer pitches is the so-called "hot spot" problem. The present disclosure proposes a method in which "heat-dissipating structures" are formed at the same time as the bumps as a hot spot countermeasure.

The method used to form heat-dissipating structures in the present disclosure is essentially the same as the method used to form the solder pillar bumps explained above. When openings are formed for the solder pillar bumps in the adhesive resin layer formed on the substrate, openings are also formed for the heat-dissipating structures in locations that do not interfere electrically with the solder pillar bumps. Afterwards, the solder pillar bumps and heat-dissipating structures are formed at the same time by filling each opening with solder and allowing the solder to cool. At this time, the heat-dissipating structures are connected thermally to the two bonded substrates without affecting the device electrically.

Figure 7C:
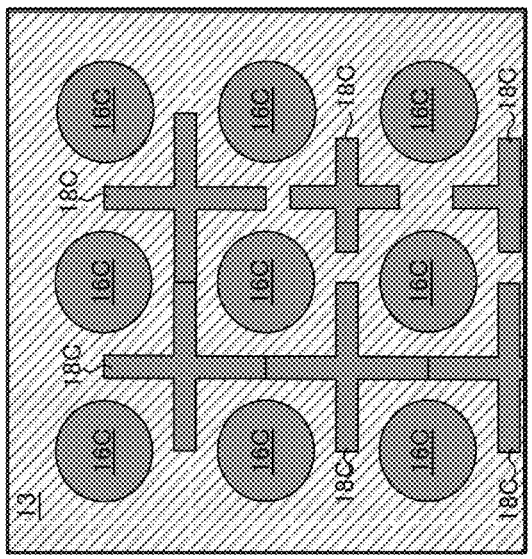
FIG. 7C is a cross-sectional view of an adhesive resin layer in which solder pillar bumps of a circle shape and heat-dissipating structures of a cross-shape have been formed simultaneously.
Figure 7B:
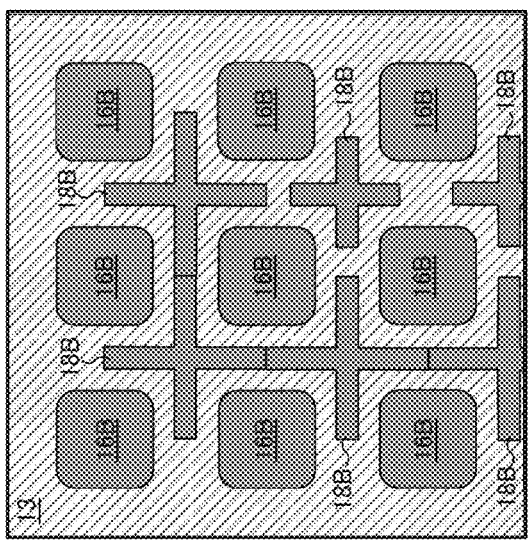
FIG. 7B is a cross-sectional view of an adhesive resin layer in which solder pillar bumps of a rectangle shape and heat-dissipating structures of a cross-shape have been formed simultaneously.
Figure 7A:
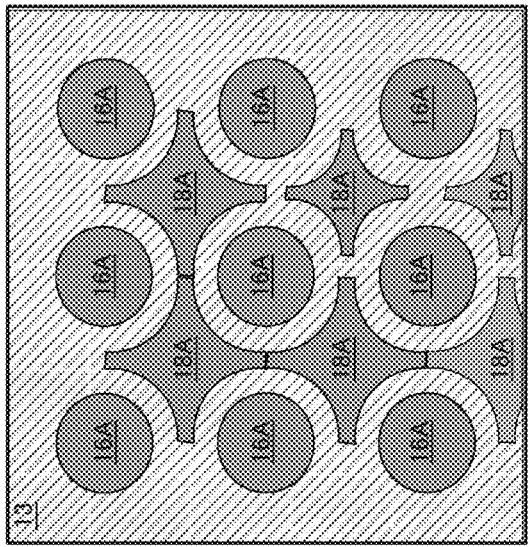
FIG. 7A is a cross-sectional view of an adhesive resin layer in which solder pillar bumps of a circle shape and heat-dissipating structures of a star-shape have been formed simultaneously.

FIG. 7 is a set of cross-sectional views of an adhesive resin layer in which solder pillar bumps and heat-dissipating structures have been formed simultaneously. FIG. 7A shows an example in which column-shaped heat-dissipating structures 18A with a star-shaped cross-section, are formed between solder pillar bumps 16A with a round cross-section. FIG. 7B shows an example in which column-shaped heat-dissipating structures 18B with a cross-shaped cross-section, are formed between solder pillar bumps 16B with a rectangular cross-section. FIG. 7C shows an example in which column-shaped heat-dissipating structures 18C with a cross-shaped cross-section, are formed between solder pillar bumps 16C with a round cross-section.

When heat-dissipating structures are formed inside the adhesive resin layer, thermal conductivity increases in the thickness direction (Z direction) between two substrates bonded via the adhesive resin layer. When a plurality of connected heat-dissipating structures 18 extend in the planar directions, the thermal conductivity can be increased in the planar directions (XY directions) in addition to the thickness direction (Z direction).

Figure 8A:
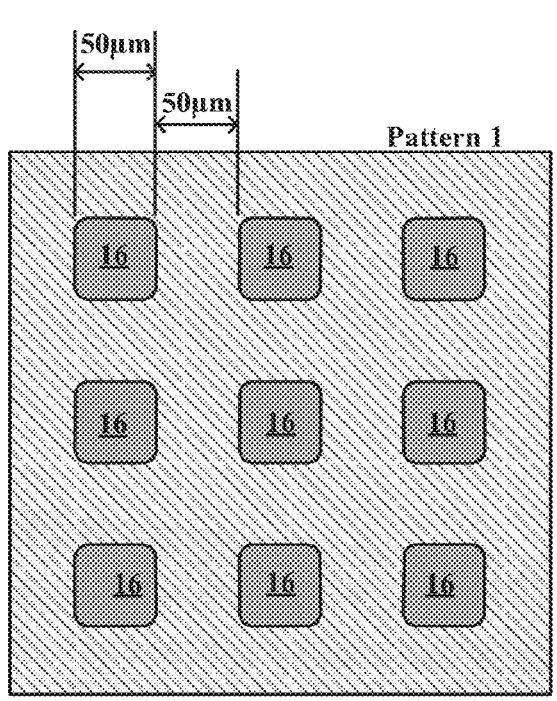
FIG. 8A is a cross-sectional view of pattern 1 where an adhesive resin layer in which solder pillar bumps of a certain size have been formed in a rectangle shape for heat dissipation testing.
Figure 8B:
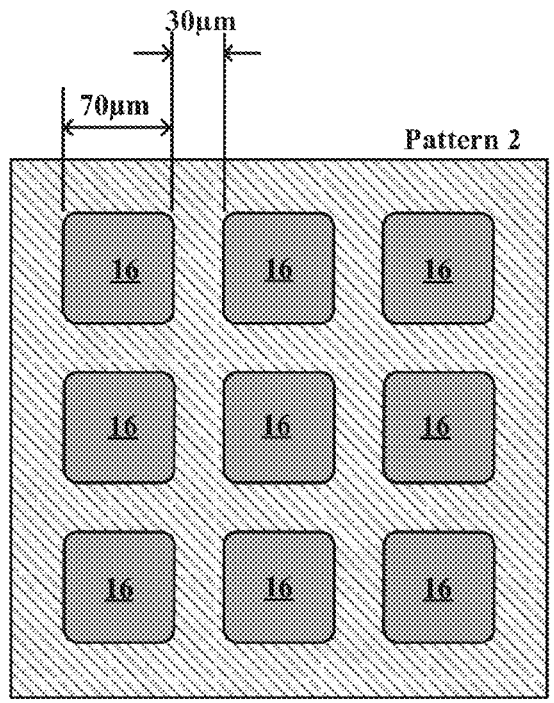
FIG. 8B is a cross-sectional view of pattern 2 where an adhesive resin layer in which solder pillar bumps of a certain size have been formed in a rectangle shape for heat dissipation testing.
Figure 8C:
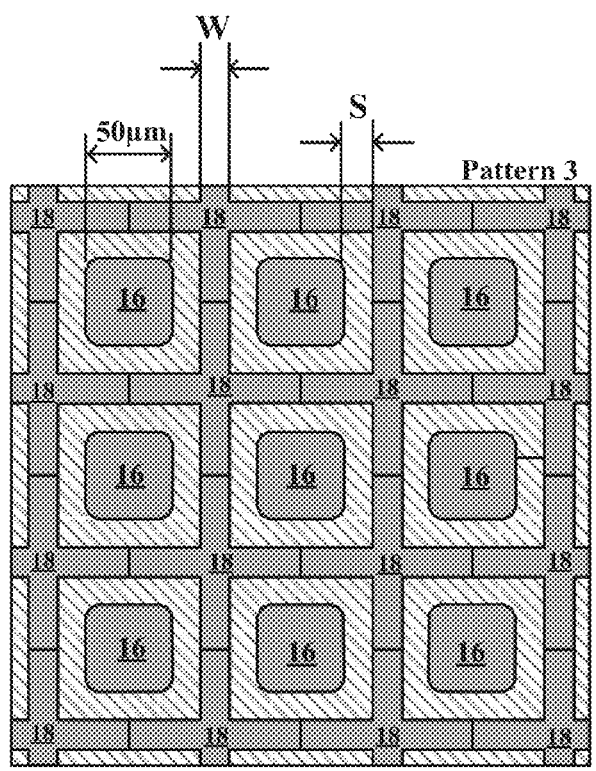
FIG. 8C is a cross-sectional view of pattern 3 where an adhesive resin layer in which solder pillar bumps of a certain size have been formed in a rectangle shape and heat-dissipating structures of variable size and distance for heat dissipation testing.

Table 1 includes the theoretical values for thermal conductivity in the thickness direction (Z direction), and the planar directions (XY directions), when solder pillar bumps 16 and heat-dissipating structures 18 are formed in Patterns 1-3 shown in FIGS. 8A, 8B, and 8C. These theoretical values were calculated using 50 W/(m·K) as the thermal conductivity of the solder and 0.5 W/(m·K) as the thermal conductivity of the resin layer.

TABLE 1

|  |  | Thickness Direction (z) | Planar Directions (xy) |
|---|---|---|---|
| Pattern 1 |  | 12.9 W/(m·K) | 1.0 W/(m·K) |
| Pattern 2 |  | 24.8 W/(m·K) | 1.6 W/(m·K) |
| Pattern 3 | W = 10 um S = 20 um | 22.3 W/(m·K) | 5.8 W/(m·K) |
| Pattern 3 | W = 20 um S = 15 um | 30.7 W/(m·K) | 11.0 W/(m·K) |

When the theoretical values of Pattern 1 and Pattern 2 are compared, it is clear that the thermal conductivity in the thickness direction (Z direction) improves as the size of the solder pillar bumps 16 is increased, and the thermal conductivity in the planar directions (XY directions) is improved somewhat when the gaps between bumps are narrowed along with the increased size of the bumps. When the theoretical values of Pattern 1 and Pattern 3 are compared, it is clear that the thermal conductivity is improved significantly in both the thickness direction (Z direction) and the planar directions (XY directions) when lattice-like heat-dissipating structures 18 extend in the planar directions.

When the substrate bonding method of the present disclosure described above is used, both lower costs and higher yields can be realized, and semiconductor devices can be manufactured with more reliable bonding.

The present disclosure was explained using a specific embodiment, but the present disclosure is not limited to these specific embodiments and examples. The present disclosure can be altered in any way conceivable by a person of skill in the art, including other embodiments, additions, modifications, and deletions. Any mode or aspect realizing the actions and effects of the present embodiment is within the scope of the present disclosure.

What is claimed is:

1. A substrate bonding method comprising:
   obtaining a first die having an adhesive resin layer with one or more pillar-shaped solder bumps in the adhesive resin layer, a pillar-shaped solder bump is formed on top of an electrode pad that is further in a first substrate;
   aligning the pillar-shaped solder bump with a second substrate terminal that is in a second substrate;

forming a second opening in a position other than a position at which an opening is formed in the adhesive resin layer above the electrode pad further in the first substrate;

forming a heat-dissipating structure for thermally connecting the first die and the second substrate by filling the second opening with molten solder; and applying heat and pressure to the first die and the second substrate.

2. The method of claim 1, wherein a head of the pillar-shaped solder bump makes reliable contact with the second substrate terminal.

3. The method of claim 1, wherein the second substrate terminal is formed from an electrode pad.

4. The method of claim 1, wherein the second substrate terminal is a second pillar-shaped solder bump.

5. The method of claim 1, wherein the heat-dissipating structure has a cross-shaped cross-section.

6. The method of claim 1, wherein the heat-dissipating structure has a star-shaped cross-section.

7. The method of claim 1, wherein a plurality of heat-dissipating structures is connected and extend in a planar direction.

8. The method of claim 1, wherein the Indium alloy contains Tin.

9. The method of claim 1, wherein the Indium alloy contains Cobalt.

10. The method of claim 1, wherein the Indium alloy contains Germanium.

11. The method of claim 1, wherein the Indium alloy contains Iron.

12. A semiconductor device, comprising:
a first die having one or more pillar-shaped solder bumps formed by:
forming an adhesive resin layer on a surface of one or more electrode pads on a first substrate,
forming a first opening on the adhesive resin layer above an electrode pad from the one or more electrode pads, and
forming a pillar-shaped solder bump by filling the first opening with a molten solder;
a second substrate having one or more substrate terminals that is electrically connected to a pillar-shaped solder bump; and
a heat-dissipating structure, wherein the heat-dissipating structure is formed by:
forming a second opening within the adhesive resin layer, in a position other than a position at which the first opening is formed in the adhesive resin layer above the one or more electrode pads, and
forming the heat-dissipating structure within the second opening within the adhesive resin layer, for thermally connecting a first die and a second substrate, by filling the second opening with the molten solder.

13. The semiconductor device of claim 12, wherein the second substrate having one or more substrate terminals is formed by:
aligning the pillar-shaped solder bump with a second substrate terminal that is in a second substrate; and
applying heat and pressure to the first die and the second substrate.

14. The semiconductor device of claim 12, wherein the heat-dissipating structure has a thermal conductivity of 1.0 W-30.7 W/(m K).

* * * * *